US008327033B2

(12) United States Patent
Chavet et al.

(10) Patent No.: US 8,327,033 B2
(45) Date of Patent: Dec. 4, 2012

(54) METHOD AND DEVICE FOR INTERLEAVING DATA

(75) Inventors: Cyrille Chavet, Saint Jean d'Avelanne (FR); Pascal Urard, Theys (FR); Philippe Coussy, Ploemeur (FR); Eric Martin, Lorient (FR)

(73) Assignees: STMicroelectronics SA, Montrouge (FR); Centre National de la Recherche Scientifique (CNRS), Paris (FR)

( * ) Notice: Subject to any disclaimer, the term of this patent is extended or adjusted under 35 U.S.C. 154(b) by 1254 days.

(21) Appl. No.: 12/150,599

(22) Filed: Apr. 29, 2008

(65) Prior Publication Data

US 2009/0031094 A1     Jan. 29, 2009

(30) Foreign Application Priority Data

Apr. 30, 2007   (FR) ...................................... 07 54793

(51) Int. Cl.
*G06F 3/00* (2006.01)
*G06F 13/00* (2006.01)
(52) U.S. Cl. .......... 710/2; 710/5; 710/8; 710/15; 710/33
(58) Field of Classification Search ........................ None
See application file for complete search history.

(56) References Cited

U.S. PATENT DOCUMENTS

2006/0179401 A1\*   8/2006   Nefedov ........................ 714/800
2008/0134008 A1\*   6/2008   Andreev et al. ............... 714/781

FOREIGN PATENT DOCUMENTS

FR    2 838 581 A1    10/2003

OTHER PUBLICATIONS

D. Gnaedig et al., "Les Turbo-Codes a Roulettes", Feb. 3, 2004, 5 pages.
Norbert Wehn, "SoC-Network for Interleaving in Wireless Communications", Jul. 11, 2003, 14 pages.
Norbert Wehn, "SoC-Network for Interleaving in Wireless Communications", Jul. 5-9, 2004, 13 pages.
Alberto Tarable et al., "Mapping Interleaving Laws to Parallel Turbo Decoder Architectures", IEEE Communications Letters, vol. 8, No. 3, Mar. 2004, pp. 162-164.
A. Tarable et al., "Mapping interleaving laws to parallel Turbo decoder", Jan. 4, 2005, pp. 1-15.

\* cited by examiner

*Primary Examiner* — Scott Sun (57) ABSTRACT

A data interleaving device is provided that includes an input, an output, and a data interleaver coupled to the input and the output. The input receives data originating from a plurality of processing blocks. The output transfers interleaved data to the plurality of processing blocks. The data interleaver includes a controller, at least one interconnection module, and a plurality of memories. The controller prepares a data-to-memory assignment data structure. The at least one interconnection module switches data in parallel according to the data-to-memory assignment data structure and acts identically on all data switched simultaneously in parallel. The plurality of memories store the switched data. The data interleaver interleaves data received from the input and provides the interleaved data at the output.

20 Claims, 11 Drawing Sheets

METHOD AND DEVICE FOR INTERLEAVING DATA

CROSS-REFERENCE TO RELATED APPLICATIONS

The present application is related to French Patent Application No. 07-54793, filed Apr. 30, 2007, entitled "METHOD AND DEVICE FOR INTERLEAVING DATA". French Patent Application No. 07-54793 is assigned to the assignee of the present application and is hereby incorporated by reference into the present disclosure as if fully set forth herein. The present application hereby claims priority under 35 U.S.C. §119(a) to French Patent Application No. 07-54793.

TECHNICAL FIELD

The invention relates to the intermixing of digital data for the implementation of an error correction code. More particularly, the invention relates to error correction coding for high speed data transmission applications, for example in the field of multimedia or telecommunications, in order to minimize the influence of errors by mixing incident data.

BACKGROUND

One particularly useful application of the invention thus relates to the interleaving of data for error correction codes, especially of the LDPC ("Low Density Parity-Check Code") or Turbo-Codes® type, in order to reduce the influence of errors on a noisy transmission channel.

Error correction codes of the LDPC or Turbo-Codes type are well-known in the state of the art.

Reference may thus be made to the prior French patent FR 91 05 280 which discloses the general principle of Turbo-Codes.

Said coding and decoding techniques are based on iterative processing of data which are mixed, at each processing stage, until succeeding in a decorrelation of the errors likely to be conveyed. Said error correction coding techniques use an interleaver that performs an iterative permutation of symbols of an input code and memory banks in which the data are stored.

Figure 1:
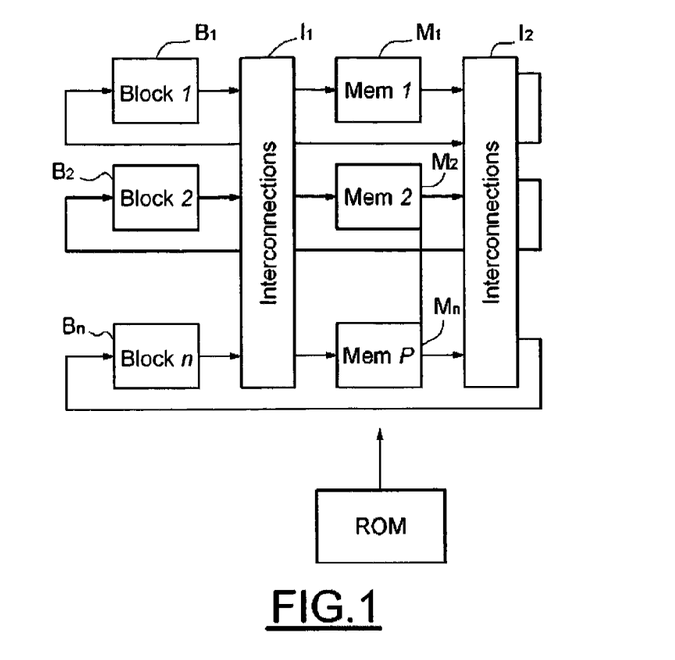
FIG. 1 illustrates an architecture of a conventional interleaving device.

FIG. 1 shows an example of architecture intended for the implementation of such data interleaving. As seen in this figure, the architecture shown is a parallel architecture. It comprises a set of data processing blocks or modules B1, B2, . . . $B_n$ arranged in parallel ensuring, in parallel, the generation and deliverance of a set of binary symbols, a set of memory banks M1, M2, . . . $M_n$ arranged in parallel and connected to the blocks B1, B2, . . . $B_n$ with interposition of interconnection modules I1 and I2 intended for the parallel processing of the symbols coming from the blocks B1, B2, . . . $B_n$, for switching them to the memory banks M1, M2, . . . $M_n$ by performing an iterative permutation of the symbol data in parallel.

Figure 2:
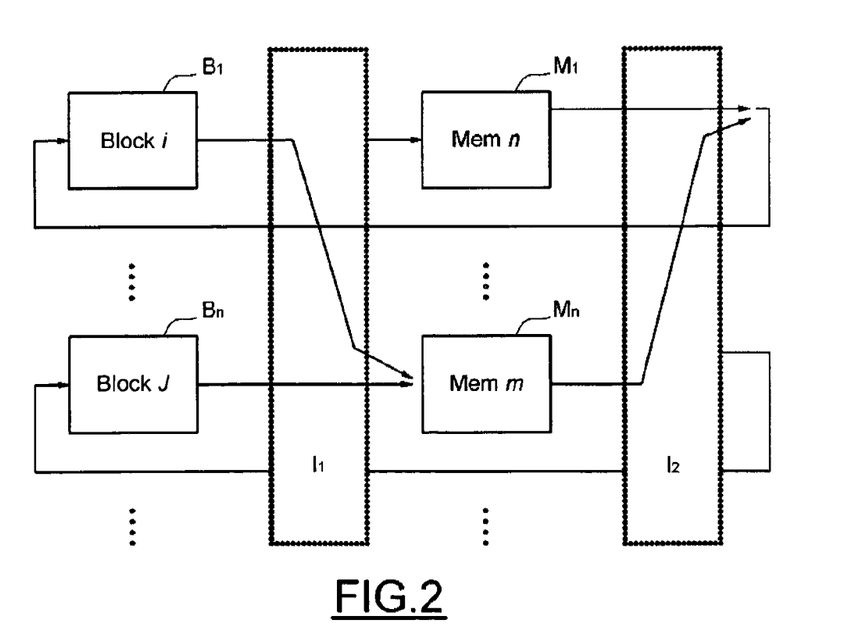
FIG. 2 illustrates a drawback associated with the use of the architecture in FIG. 1.

One of the major problems associated with the implementation of this type of interleaving architecture relates to memory access conflicts. This is because, as seen in FIG. 2, with this type of architecture, it is possible that two or more blocks B1, B2, . . . $B_n$ producing or using data may attempt to write or, on the contrary, to read different data at the same time into or from the same memory bank.

Various techniques have been developed to try to overcome this drawback. One of these techniques, disclosed in detail in the document FR 02 04 764, called "multiple slice turbo-code", is based on the definition of a circular interleaving rule that can be used to implement an interleaver having a high degree of parallelism with performances equivalent to, or better than those of the known turbo-codes, whilst enabling the complexity of the interconnection architecture to be reduced, in particular for very high throughput applications.

The principle of multiple slice turbo-codes is based on splitting an information frame of N symbols into P blocks of M symbols. The coding operation is first performed in a natural order in order to generate a redundancy in a first dimension. Each block is then coded independently by a circular recursive systematic convolutional code (CRSC). The information frame is then permuted by an interleaver of N symbols in size. The interleaved frame is also split into P blocks of length N and each block is coded independently by a CRSC code to produce the redundancy in a second dimension.

The interleaver is constructed jointly with the memory organization so as to enable parallel decoding of the P blocks. In other words, the interleaver structure is chosen so as to enable the P data necessary to the P decoders of the P memory banks to be read and written at each cycle, without conflict.

Actually, a single reading may be performed at the same instant in a memory. However, this technique is based on the implementation of a specific interleaving rule and does not therefore conform to a standard.

Another technique, described in the document "SoC-Network for Interleaving in Wireless Communications" by N. Wehn, MPSoC, 2004, is based on an addition of memories into the network in order to provide a time delay of the data in the event of a conflict situation. However, this technique increases the latency of the circuit and produces complex interconnection networks. Furthermore, it is necessary to carry out the dimensioning of the added memories by simulation.

Finally, another approach, suggested by Benedetto and described in the article "Mapping Interleaving Laws to Parallel Turbo-decoder Architectures" published in IEEE volume 8, March 2004, consists in arranging the data in memory banks so as to avoid collisions. In particular, this approach suggests identifying the data which are intended to be used at the same time on a tiling matrix. A simple first assignment is made in the memory banks, without generating any conflict and a bank is assigned to the non-allocated data by correcting the conflicts using a so-called "simulated annealing" or "iterative refinement" method.

Although this technique can be used to find a memory arrangement whatever the interleaving rule, it nevertheless presents a certain number of major drawbacks, chiefly due to the fact that it does not enable a memory arrangement to be generated which can then be used to produce a hardware architecture using simple components, so that the interconnections network is liable to display a complicated architecture.

Furthermore, the simulated annealing algorithm is relatively complex to implement and does not allow its outcome to be determined a priori.

Finally, this technique requires the use of two ROM type memories per frame format for storing the natural and interleaved access orders in memory.

SUMMARY

In view of the foregoing, a method of interleaving data is provided comprising the switching of data to means of memory storage by means of a data memory assignment matrix, in which the matrix is prepared so as to switch the data in memory by using systematic processing means adapted for acting identically on all the data switched simultaneously.

In other words, within the context of the present disclosure, a method of interleaving is provided that enables the interconnections network to be simplified and that implements an interleaving rule in conformity with standards.

In one embodiment, the data memory assignment matrix is developed by successive stages during which data are assigned to memory locations so as to avoid memory access conflicts.

In another aspect of the method of interleaving, assignment in memory is determined based on the input data order and an interleaving rule, using two intermediate matrices in each of which memory locations are successively assigned in such a way that switching data at successive instants takes place with the aid of said systematic processing means, and by copying the memory assignments from one of the intermediate matrices to the other.

For example, the data input order and the interleaving rule are represented by an input matrix and an interleaving matrix respectively, whose columns each correspond to simultaneous accesses to data in parallel.

In one embodiment, memory locations are assigned to a first intermediate matrix in the form of a first memory location column, the memory locations are transferred into the second intermediate matrix from the corresponding data location in the interleaving matrix.

In a further embodiment, memory locations are assigned to a first column of the second intermediate matrix and the memory locations are transferred into the first intermediate matrix from the corresponding data location in the input matrix.

In a further embodiment, the memory locations are successively assigned to one of the intermediate matrices and the memory locations are transferred into other intermediate matrices until all of the first and second intermediate matrices are filled.

The memory location assignment step may be performed so as to avoid access conflicts.

According to a second embodiment, a data interleaving device of a first data processing module set arranged in parallel to a second set of processing modules arranged in parallel comprises a set of memory banks in parallel and switching means interposed between the memory banks and the first and second sets of data processing modules.

In this embodiment, the switching means are achieved from systematic data processing means adapted for acting identically on all the data switched simultaneously in parallel.

The data processing means may include data permutation means.

Aspects of the disclosure may be found in a method of interleaving data. The method includes preparing a data-to-memory assignment data structure and switching data in parallel according to the data-to-memory assignment data structure using at least one interconnection module operable to act identically on all data switched simultaneously in parallel. The method also includes storing the switched data in a plurality of memories.

Other aspects of the disclosure may be found in a data processing module that includes a data interleaving device. The data interleaving device includes a controller, at least one interconnection module, and a plurality of memories. The controller prepares a data-to-memory assignment data structure. The at least one interconnection module switches data in parallel according to the data-to-memory assignment data structure and acts identically on all data switched simultaneously in parallel. The plurality of memories store the switched data.

Further aspects of the invention may be found in a data interleaving device that includes an input, an output, and a data interleaver coupled to the input and the output. The input receives data originating from a plurality of processing blocks. The output transfers interleaved data to the plurality of processing blocks. The data interleaver includes a controller, at least one interconnection module, and a plurality of memories. The controller prepares a data-to-memory assignment data structure. The at least one interconnection module switches data in parallel according to the data-to-memory assignment data structure and acts identically on all data switched simultaneously in parallel. The plurality of memories store the switched data. The data interleaver interleaves data received from the input and provides the interleaved data at the output.

Other technical features may be readily apparent to one skilled in the art from the following figures, descriptions and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

First of all, a description will be given referring to FIGS. 3 to 12, of an example of implementing a method of interleaving data according to one embodiment of the present disclosure.

In the illustrated embodiment, the data originating from the processing modules are presented in the following natural order:

{1, 2, 3, ..., 12}

After interleaving, the interleaving rule provides that the interleaved data are presented in the following order:

{10, 1, 4, 7, 8, 11, 3, 6, 2, 5, 9, 12}.

Figure 3:
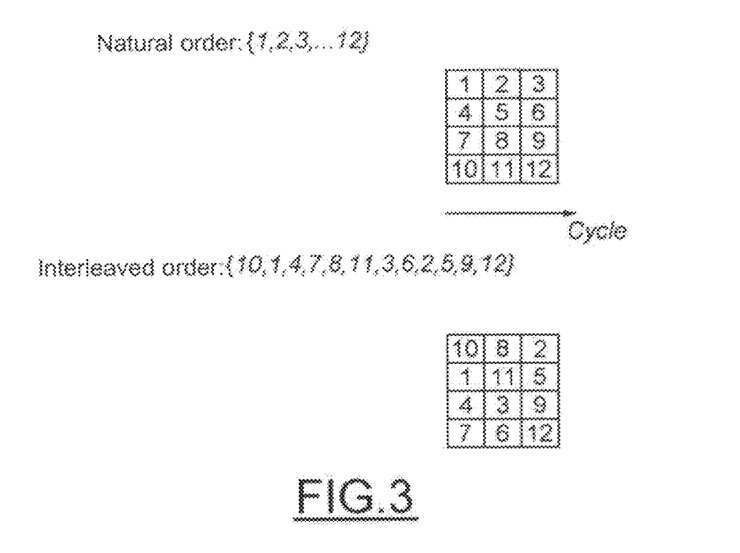
FIG. 3 illustrates the order of the data as delivered to the switching module, before interleaving and the order of the data after interleaving.

The natural order of the data and the order of the interleaved data are respectively illustrated by the matrices M1 and M2 seen in FIG. 3.

Furthermore, in this embodiment, the data are delivered by four data producing or consuming processing modules. In addition, the interleaving architecture comprises four memory banks, hereafter designated by the references B1, B2, B3 and B4. The interleaving architecture and the corresponding method of interleaving are intended to enable the data to be arranged in memory starting from the natural order, taking into account the interleaved order whilst avoiding conflicts.

To do so, starting from the matrix showing the natural order of the data, as delivered by the processing modules, an assignment is first of all made of the four memory banks B1, B2, B3 and B4 to a set of input matrix locations "matrix IN".

Figure 4:
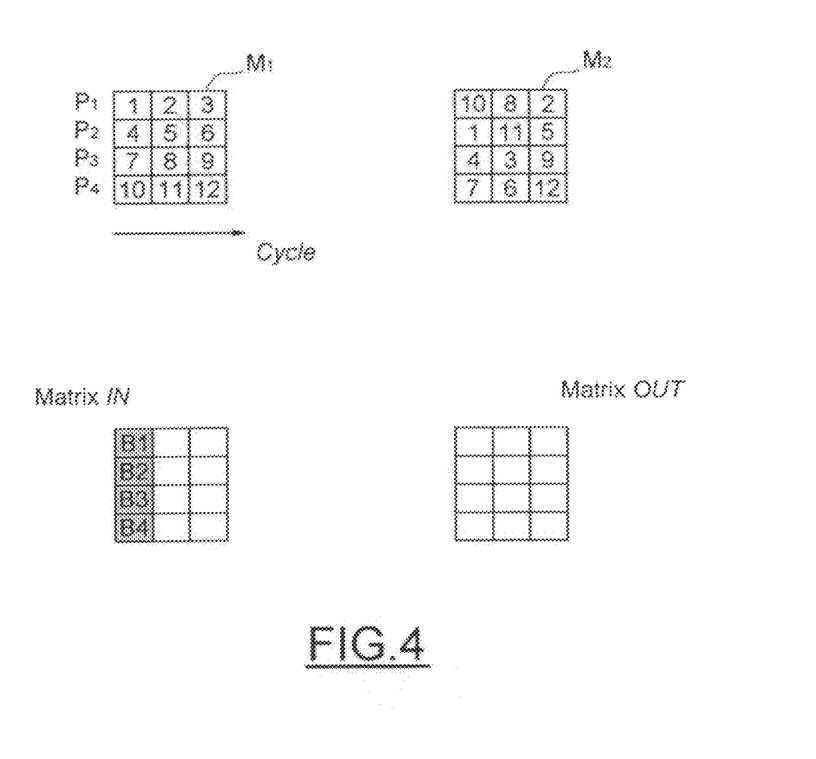
FIG. 4 is a diagram illustrating a first phase of a mode of implementation of a method of interleaving according to the disclosure.

This involves, e.g. in the illustrated embodiment, assigning the four memory banks B1, B2, B3 and B4 to the four locations of the first column of the input matrix (FIG. 4).

Figure 5:
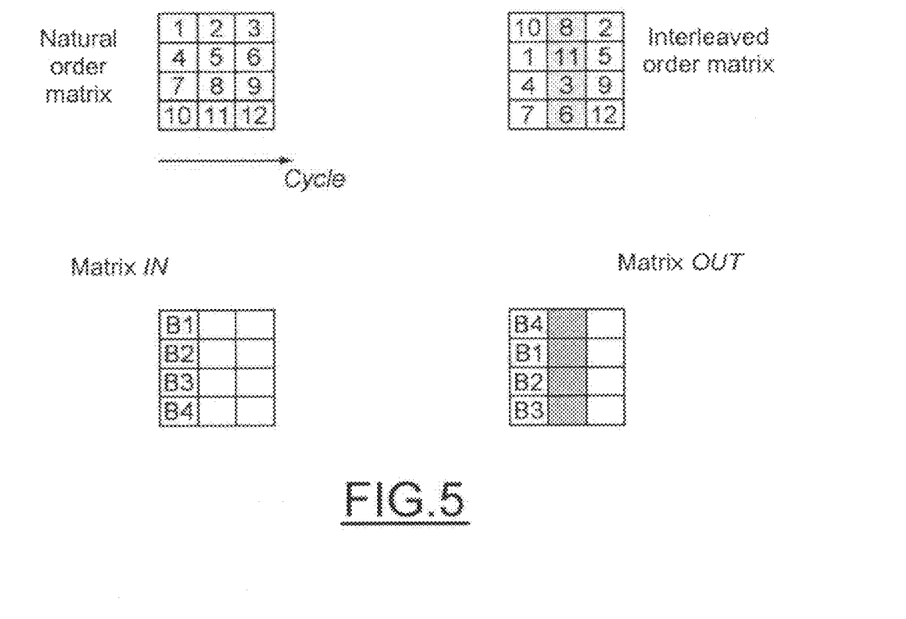
FIG. 5 illustrates the phase of copying the memory locations of the first intermediate matrix to the second intermediate matrix.

During the next step, seen in FIG. 5, the constraints thus devised are transferred onto the output matrix "matrix OUT". As shown, this involves identifying in the interleaving matrix M2, the memory locations corresponding to the interleaved data.

The method of interleaving uses two intermediate matrices, namely the input matrix and the output matrix, to assign memory banks into one of the matrices, and to transfer into the other matrix, the memory banks corresponding to the interleaved order. These steps are repeated until the two intermediate matrices are completely filled.

Figure 6:
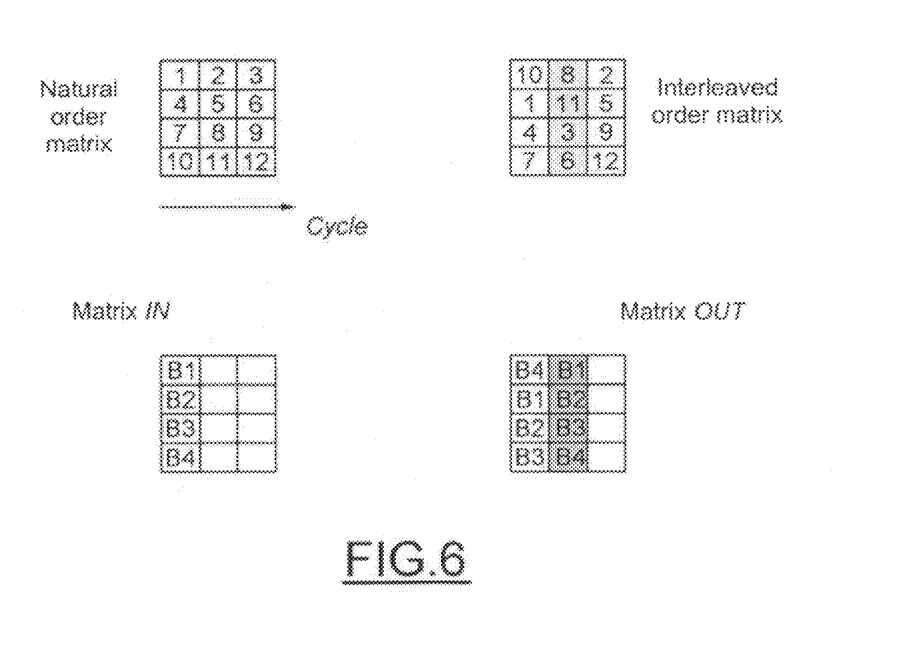
FIG. 6 illustrates the phase of assigning memory locations in the second intermediate matrix.

Thus, as seen in FIG. 6, after having transferred into the output matrix, the memory banks assigned to the first column of the input matrix, taking into account the order of the interleaved data, the memory banks are assigned into the output matrix to the next columns of this matrix.

Figure 7:
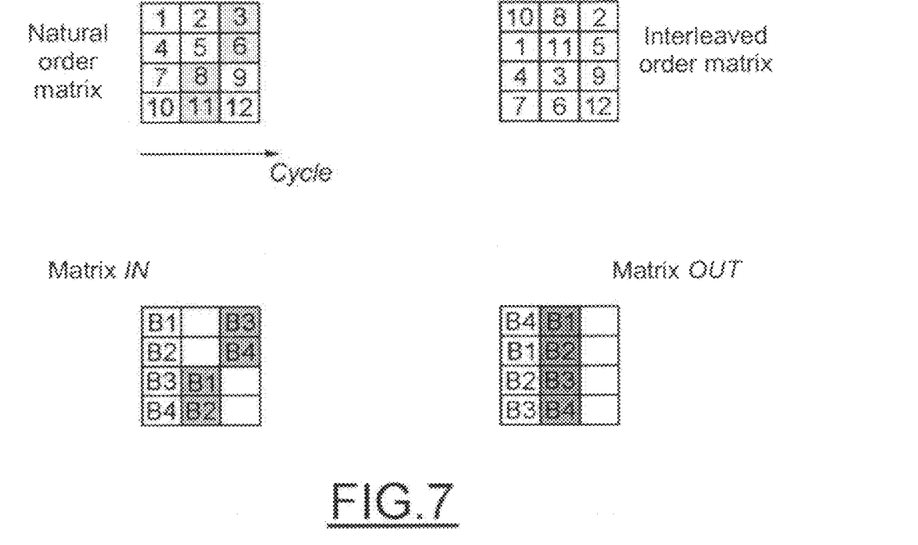
FIG. 7 illustrates a phase of copying the memory locations of the second intermediate matrix to the first intermediate matrix.

Thus, in the same way, the memory banks assigned to the output matrix are transferred by identifying the value of the corresponding data in the interleaving matrix and by copying the memory banks into the input matrix, taking into account the natural order of data identified by the matrix M1 (FIG. 7).

Figure 8:
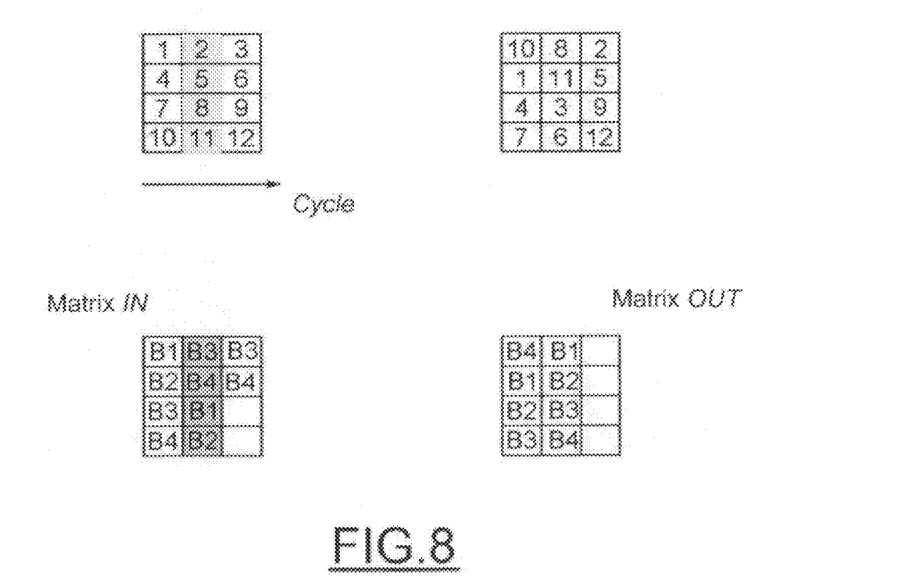
FIG. 8 illustrates a subsequent step of copying memory locations in the first intermediate matrix.

During the next step, illustrated in FIG. 8, a new memory bank assignment step is carried out, on the basis of the natural order. However, in this case, care is taken to assign the memory banks B3 and B4 in a particular order in order to avoid access conflicts, but also to enable the use of means of permutation for the passage of data from a previous column to a current column.

Actually, at this stage, the memory bank B3 should be assigned to the cell (1, 2) of the input matrix in order to enable the use of means of permutation between the first column and the second column.

Figure 9:
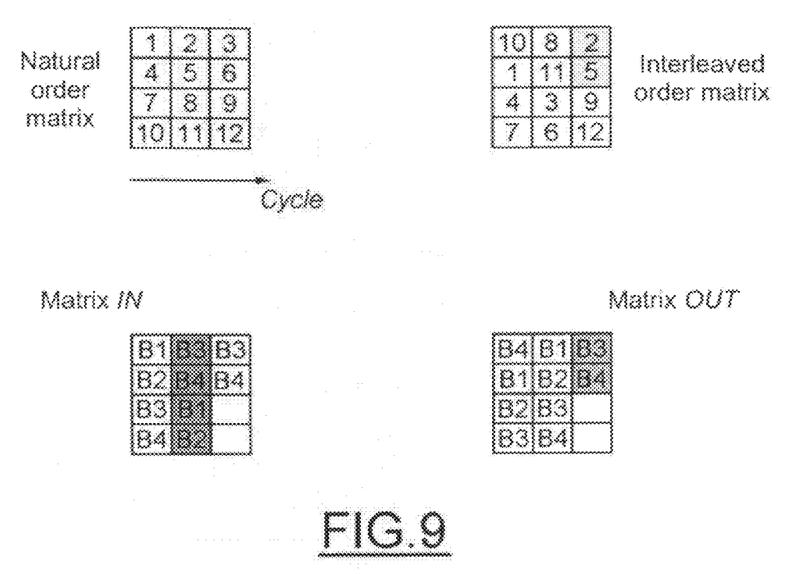
FIG. 9 shows a subsequent phase during which the memory locations of the first intermediate matrix are transferred to the second intermediate matrix.

After this assignment has been performed, the memory banks are transferred in the same way, referring to FIG. 9, into the output matrix, taking into account the interleaved order.

Figure 10:
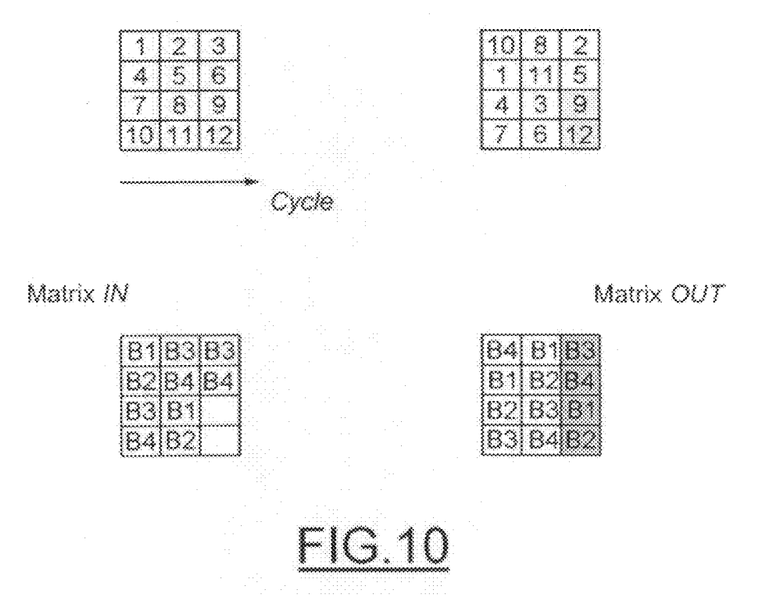
FIG. 10 shows a subsequent phase of filling the second intermediate matrix.
Figure 11:
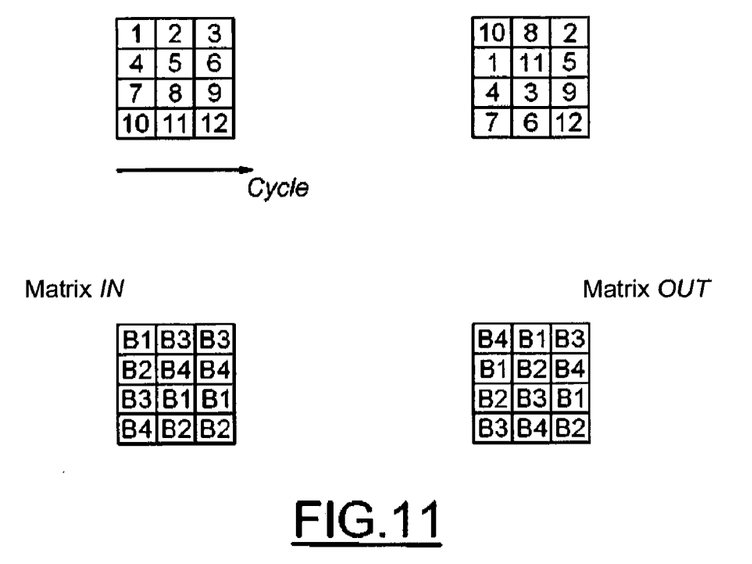
FIG. 11 shows a final phase during which the memory locations of the second intermediate matrix are transferred to the first intermediate matrix.

As seen in FIGS. 10 and 11, the last two free boxes of the output matrix should then simply be filled and the memory banks transferred into the input matrix taking the natural order into account.

Figure 12:
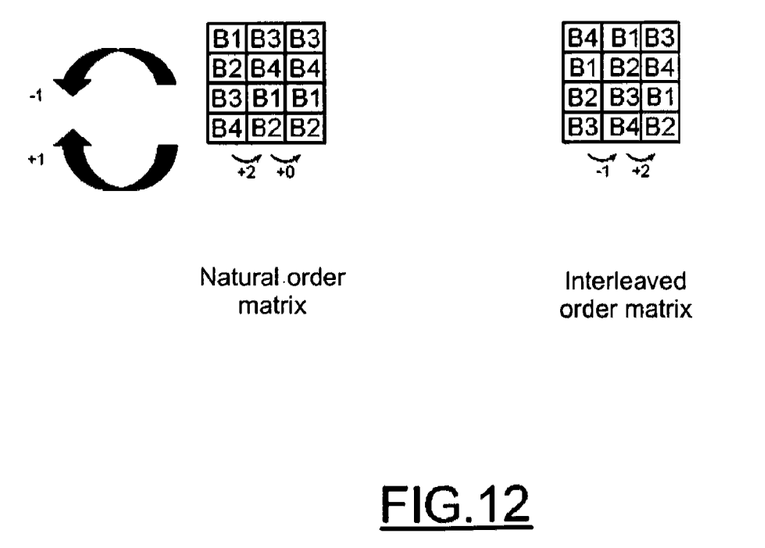
FIG. 12 is a diagram illustrating the use of a means of data permutation for successively accessing the set of memory banks.

Thus, as seen in FIG. 12, starting from the natural order, the data can be successively arranged in the input matrix, producing on the one hand a double offset and, on the other, a neutral offset.

Thus it will be appreciated that it is possible to minimize the complexity of controlling the means of permutation which, as far as the second offset is concerned, can then be inactivated.

As far as the interleaved order is concerned, the data are successively arranged in memory by implementing a permutation of "−1" and a double permutation of "+2".

Thus it can be seen that the interleaving can be implemented by means of an arrangement of the data in memory using only "barrel-shifter" type offset means.

The data arranged in memory are then arranged according to the following sequences, as far as banks B1, B2, B3 and B4 are concerned.

Bank B1: {1, 8, 9,}
Bank B2: {4, 11, 12}
Bank B3: {2, 3, 7}
Bank B4: {5, 6, 10}

Figure 13:
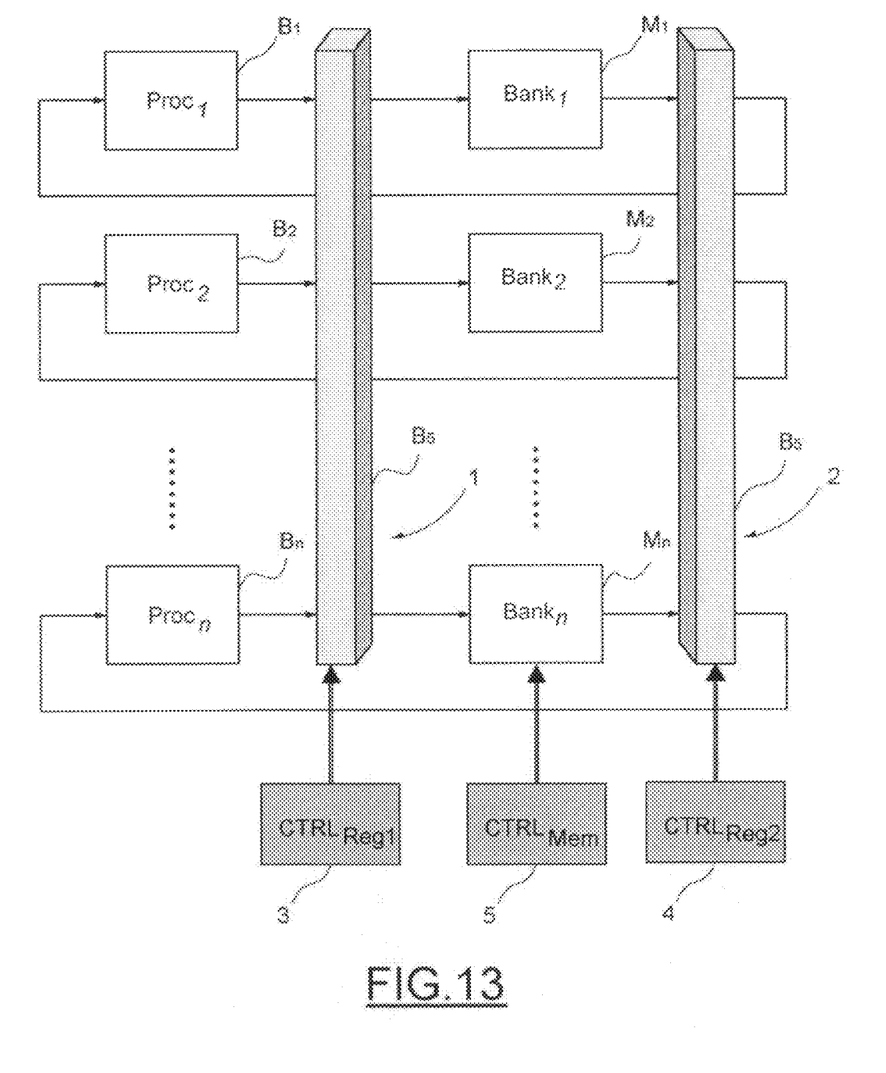
FIG. 13 is an example of architecture for an implementation of a method of interleaving according to the disclosure.

Thus, as seen in FIG. 13, the architecture enabling the method of interleaving to be implemented that has just been described, only uses regular data permutation means, e.g. of the "barrel-shifter" type, 1, 2 each controlled by a means of control 3, 4 providing memory storage of the data originating from the processing blocks B1, B2, ..., $B_n$ in the memory banks M1, M2, ... $M_n$ themselves controlled by a means of control 5 used for addressing the memory banks.

This overall scheme can be achieved by means of various types of architectures.

Figure 14:
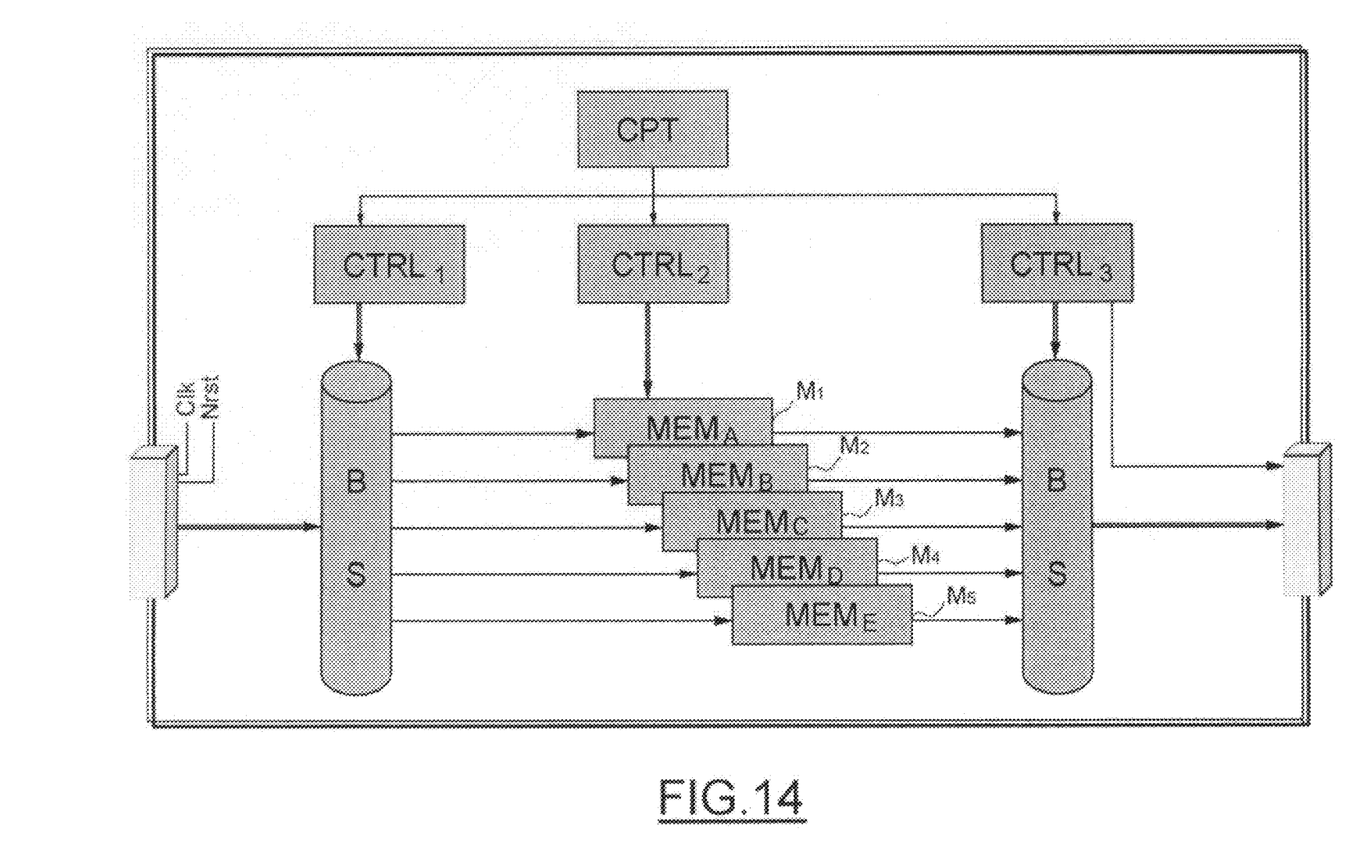
FIGS. 14 to 17 illustrate different embodiments of the disclosure.

Thus, referring to FIG. 14, which illustrates a first embodiment of the disclosure, provision is made to access in parallel different memory banks M1, M2, M3, M4 and M5 placed between two permutation stages. As can be seen, the permutation stages BS and the memory banks are each controlled by a control stage CTRL1, CTRL2 and CTRL3 under the control of a counter CPT.

Figure 15:
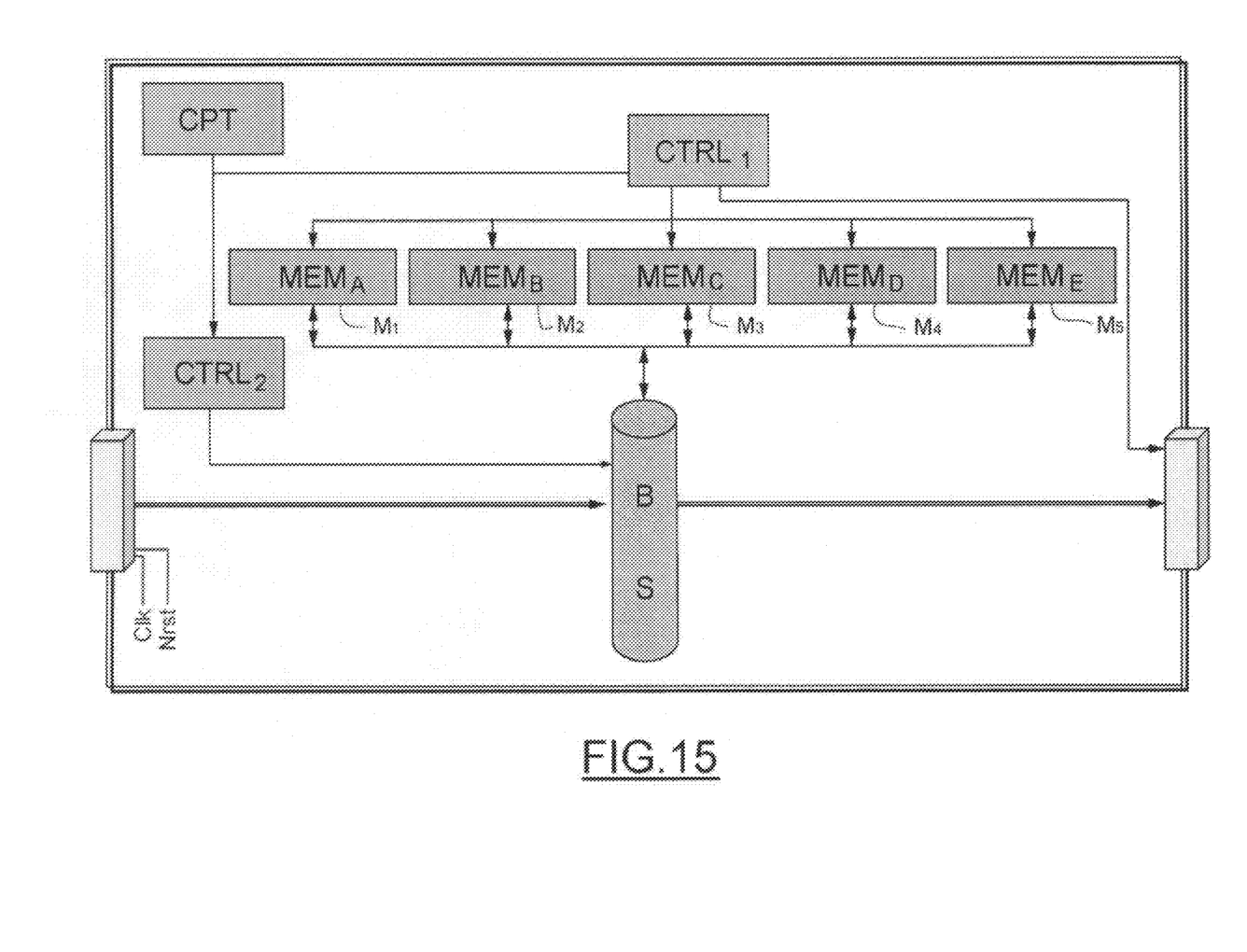

As seen in FIG. 15, in a second embodiment, a single permutation stage BS can also be used for accessing the set of memory banks M1, M2, M3, M4 and M5.

Figure 16:
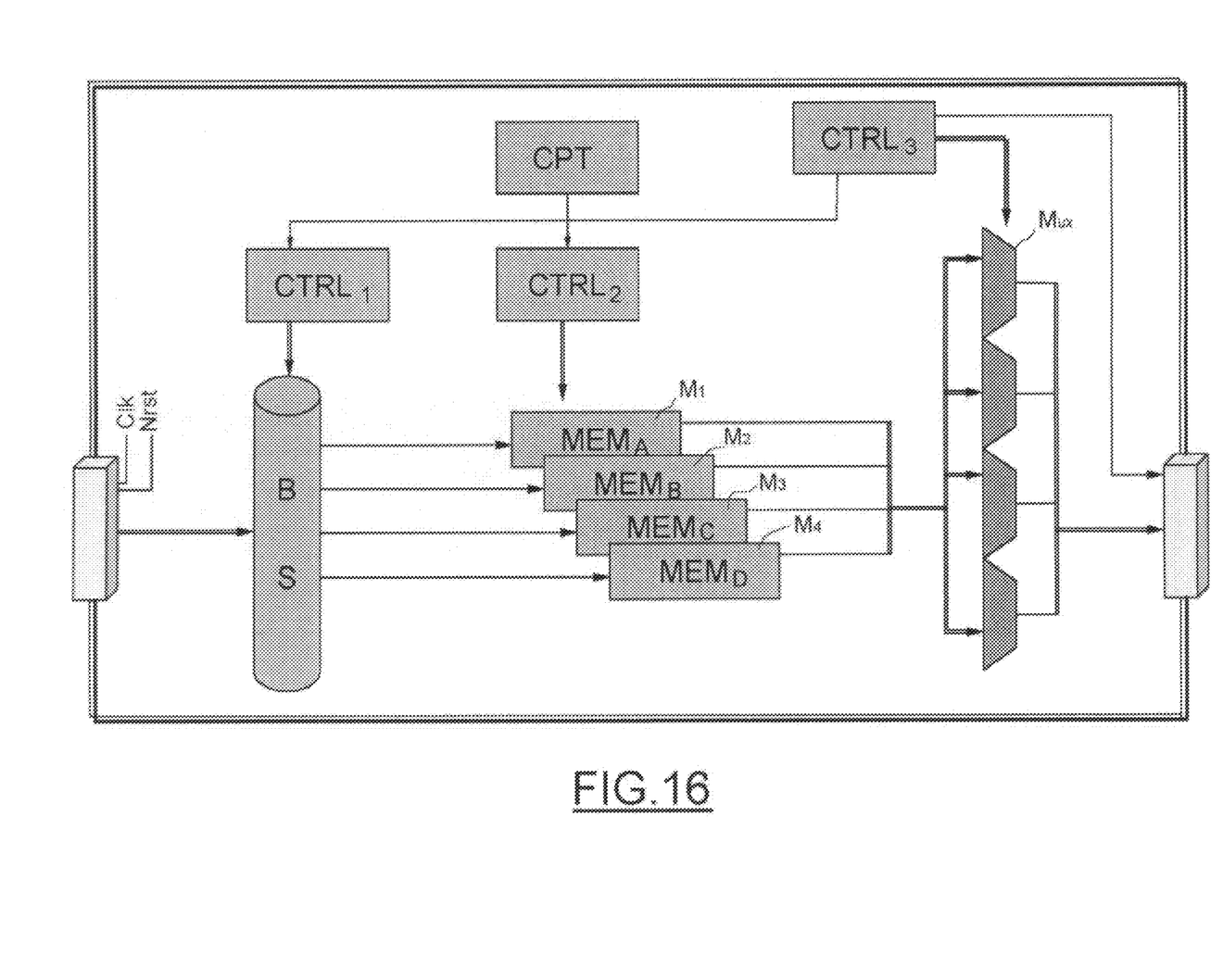

In a third embodiment, seen in FIG. 16, a single permutation stage BS is used for accessing, in parallel, memory banks M1, M2, M3 and M4 under the control of respective control stages CTRL1 and CTRL2, themselves under the control of a counter CPT. The memory banks M1, M2, M3 and M4 are themselves connected to multiplexers MUX controlled by a control stage CTRL3.

Figure 17:
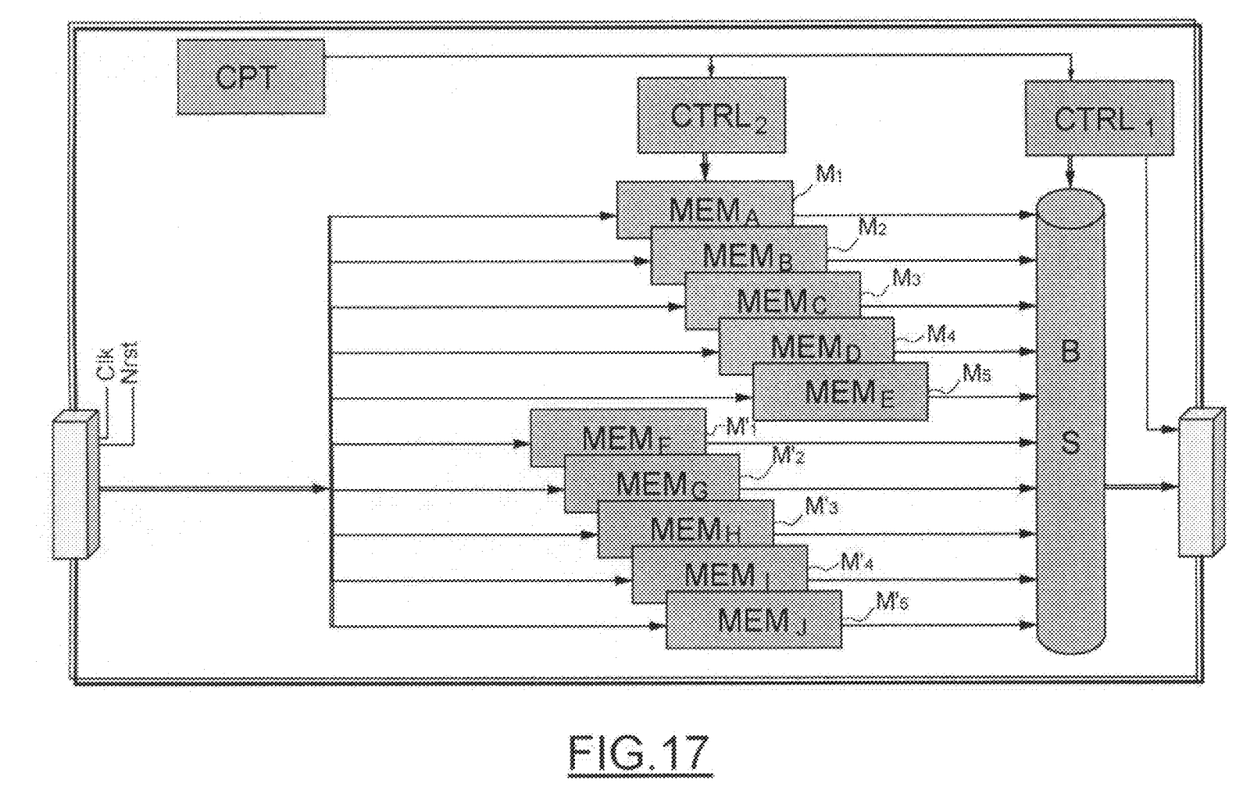

Finally, in a fourth embodiment, shown in FIG. 17, the permutation stage BS is placed downstream from the memory banks M1, M2, M3, M4, M5 and M'1, M'2, M'3, M'4 and M'5 for example for receiving data in parallel originating from said processing stages.

It may be advantageous to set forth definitions of certain words and phrases used in this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method of interleaving data, the method comprising:
   preparing a data-to-memory assignment data structure by successively assigning memory locations to one of a first intermediate matrix and a second intermediate matrix based on an input data order and an interleaving rule, the second intermediate matrix having the same dimensions as the first intermediate matrix;
   switching data in parallel according to the data-to-memory assignment data structure using at least one interconnection module configured to act identically on all data switched simultaneously in parallel and to switch data at successive instants; and
   storing the switched data in a plurality of memories.

2. The method of claim 1, wherein in preparing the data-to-memory assignment data structure, data are assigned to the plurality of memories so as to avoid memory access conflicts.

3. The method of claim 2, wherein preparing a data-to-memory assignment data structure further comprises:
   copying the memory location assignments from the one of the first intermediate matrix and the second intermediate matrix to the other of the first intermediate matrix and the second intermediate matrix.

4. The method of claim 3, wherein the data input order and the interleaving rule are represented by an input matrix and an interleaving matrix respectively, whose columns each correspond to simultaneous accesses to data in parallel.

5. The method of claim 4, wherein assigning memory locations comprises:
   assigning memory locations to the first intermediate matrix as a first memory location column; and
   transferring the assigned memory locations from the first intermediate matrix into the second intermediate matrix according to data in the interleaving matrix.

6. The method of claim 5, wherein assigning memory locations further comprises:
   assigning memory locations to a second memory location column of the second intermediate matrix; and
   transferring the assigned memory locations from the second intermediate matrix into the first intermediate matrix according to data in the input matrix.

7. The method of claim 6, wherein the memory locations are successively assigned to one of the intermediate matrices and transferred into the other intermediate matrix until both the first and second intermediate matrices are filled.

8. The method of claim 7, wherein the memory locations are assigned so as to avoid memory access conflicts.

9. A data processing module including a data interleaving device the data processing module comprising:
   a controller configured to prepare a data-to-memory assignment data structure by successively assigning memory locations to one of a first intermediate matrix and a second intermediate matrix based on an input data order and an interleaving rule, the second intermediate matrix having the same dimensions as the first intermediate matrix;
   at least one interconnection module configured to act identically on all data switched simultaneously in parallel and to switch data in parallel at successive instants according to the data-to-memory assignment data structure; and
   a plurality of memories configured to store the switched data.

10. The data processing module of claim 9, wherein the controller is configured to assign data to the plurality of memories so as to avoid memory access conflicts.

11. The data processing module of claim 10, wherein the controller is further configured to
    copy the memory assignments from the one of the first intermediate matrix and the second intermediate matrix to the other of the first intermediate matrix and the second intermediate matrix.

12. The data processing module of claim 11, wherein the controller is configured to represent the data input order and the interleaving rule by an input matrix and an interleaving matrix respectively, whose columns each correspond to simultaneous accesses to data in parallel.

13. The data processing module of claim 12, wherein the controller is configured to:
    assign memory locations to the first intermediate matrix as a first memory location column; and
    transfer the assigned memory locations from the first intermediate matrix into the second intermediate matrix according to data in the interleaving matrix.

14. The data processing module of claim 13, wherein the controller is configured to:
    assign memory locations to a second memory location column of the second intermediate matrix; and
    transfer the assigned memory locations from the second intermediate matrix into the first intermediate matrix according to data in the input matrix.

15. The data processing module of claim 14, wherein the memory locations are successively assigned to one of the intermediate matrices and transferred into the other intermediate matrix until both the first and second intermediate matrices are filled.

16. The data processing module of claim 15, wherein the memory locations are assigned so as to avoid memory access conflicts.

17. A data interleaving device, comprising:
    an input, configured to receive data originating from a plurality of processing blocks;
    an output, configured to transfer interleaved data to the plurality of processing blocks; and
    a data interleaver coupled to the input and the output, the data interleaver comprising:
      a controller configured to prepare a data-to-memory assignment data structure by successively assigning memory locations to one of a first intermediate matrix and a second intermediate matrix based on an input data order and an interleaving rule, the second intermediate matrix having the same dimensions as the first intermediate matrix;
      at least one interconnection module configured to act identically on all data switched simultaneously in parallel and to switch data in parallel at successive instants according to the data-to-memory assignment data structure; and
      a plurality of memories configured to store the switched data,
    wherein the data interleaver is configured to interleave data received from the input and to provide the interleaved data at the output.

18. The data interleaving device of claim 17, wherein the controller is further configured to:

copy the memory assignments from the one of the first intermediate matrix and the second intermediate matrix to the other of the first intermediate matrix and the second intermediate matrix.

19. The data interleaving device of claim 18, wherein the controller is configured to represent the data input order and the interleaving rule by an input matrix and an interleaving matrix respectively, whose columns each correspond to simultaneous accesses to data in parallel.

20. The data interleaving device of claim 19, wherein the controller is configured to:

assign memory locations to the first intermediate matrix as a first memory location column;

transfer the assigned memory locations from the first intermediate matrix into the second intermediate matrix according to data in the interleaving matrix;

assign memory locations to a second memory location column of the second intermediate matrix; and transfer the assigned memory locations from the second intermediate matrix into the first intermediate matrix according to data in the input matrix.

* * * * *